US008610278B1

United States Patent
Ott et al.

(10) Patent No.: US 8,610,278 B1
(45) Date of Patent: Dec. 17, 2013

(54) USE OF GRAPHENE TO LIMIT COPPER SURFACE OXIDATION, DIFFUSION AND ELECTROMIGRATION IN INTERCONNECT STRUCTURES

(75) Inventors: John A. Ott, Greenwood Lake, NY (US); Ageeth A. Bol, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/587,521

(22) Filed: Aug. 16, 2012

Related U.S. Application Data

(63) Continuation of application No. 13/551,962, filed on Jul. 18, 2012.

(51) Int. Cl.
*H01L 23/48* (2006.01)
*H01L 23/52* (2006.01)
*H01L 29/40* (2006.01)

(52) U.S. Cl.
USPC ........... 257/758; 257/751; 257/738; 257/759; 257/781; 257/379; 438/627; 438/618; 438/225; 438/624; 438/677

(58) Field of Classification Search
USPC ......... 257/758, 751, 762, 738, 759, 781, 379, 257/774, 780, 24, 752; 438/618, 627, 687, 438/225, 624, 677, 52, 612, 632, 637, 128
See application file for complete search history.

(56) References Cited

U.S. PATENT DOCUMENTS

| | | |
|---|---|---|
| 2009/0029221 A1 | 1/2009 | Goddard et al. |
| 2009/0257270 A1 | 10/2009 | Schricker et al. |
| 2010/0181655 A1 | 7/2010 | Colombo et al. |
| 2011/0006425 A1 | 1/2011 | Wada et al. |
| 2011/0018095 A1 | 1/2011 | Booth, Jr. et al. |
| 2011/0091647 A1 | 4/2011 | Colombo et al. |
| 2011/0115094 A1 | 5/2011 | Darnon et al. |
| 2011/0303899 A1 | 12/2011 | Padhi et al. |
| 2012/0139114 A1* | 6/2012 | Zhang et al. ................... 257/751 |
| 2012/0168724 A1* | 7/2012 | Park et al. ........................ 257/29 |
| 2012/0205626 A1* | 8/2012 | Dimitrakopoulos et al. ... 257/24 |

OTHER PUBLICATIONS

Bhaviripudi, S., et al., "Role of Kinetic Factors in Chemical Vapor Deposition Synthesis of Uniform Large Area Graphene Using Copper Catalyst", Nano Lett., Sep. 2, 2010, 10, 4128-4133.
Li, X., et al., "Large-Area Synthesis of High-Quality and Uniform Graphene Films on Copper Foils", Science, Jun. 5, 2009, vol. 324, www.sciencemag.org.
Yu, T., et al., "Bilayer Graphene System: Current-Induced Reliability Limit", IEEE Electron Device Letters, Oct. 2010, vol. 31, No. 10.
Yu, T., et al., "Three-Dimensional Stacked Multilayer Graphene Interconnects", IEEE Electron Device Letters, Aug. 2011, vol. 32, No. 8.
U.S. Appl. No. 13/468,693 entitled, "Graphene Cap for Copper Interconnect Structures", filed May 10, 2012, First Named Inventor: Griselda Bonilla.

* cited by examiner

*Primary Examiner* — Telly Green
(74) *Attorney, Agent, or Firm* — Scully, Scott, Murphy & Presser, P.C.; Louis J. Percello, Esq.

(57) ABSTRACT

A contiguous layer of graphene is formed on exposed sidewall surfaces and a topmost surface of a copper-containing structure that is present on a surface of a substrate. The presence of the contiguous layer of graphene on the copper-containing structure reduces copper oxidation and surface diffusion of copper ions and thus improves the electromigration resistance of the structure. These benefits can be obtained using graphene without increasing the resistance of copper-containing structure.

16 Claims, 5 Drawing Sheets

USE OF GRAPHENE TO LIMIT COPPER SURFACE OXIDATION, DIFFUSION AND ELECTROMIGRATION IN INTERCONNECT STRUCTURES

CROSS REFERENCE TO RELATED APPLICATION

This application is a continuation of U.S. patent application Ser. No. 13/551,962, filed Jul. 18, 2012, the entire content and disclosure of which is incorporated herein by reference.

BACKGROUND

The present disclosure relates to a semiconductor structure and a method of forming the same. More particularly, the present disclosure relates to a back-end-of-the-line (BEOL) interconnect structure including graphene present on exposed sidewall surfaces and a topmost surface of a copper, Cu, structure.

Integrated circuits (ICs) typically include a plurality of semiconductor devices and interconnect wiring. Networks of metal interconnect wiring typically connect the semiconductor devices from a semiconductor portion of a semiconductor substrate. Multiple levels of metal interconnect wiring above the semiconductor portion of the substrate are connected together to form a back-end-of-the-line (BEOL) interconnect structure. Within such a structure, metal lines run parallel to the substrate and metal vias run perpendicular to the substrate.

Two developments in the last decade have contributed to increased performance of contemporary ICs. One such development is the use of copper as the interconnect metal of the BEOL interconnect structure. Copper is advantageous because it has a higher conductivity compared with other traditionally used interconnect metals such, as for, example, aluminum.

A second development is the employment of low dielectric constant (low k) dielectric materials and/or air gaps within the BEOL interconnect structure. Low k dielectric materials and air gaps have dielectric constants that are lower than those of traditionally used interconnect dielectric materials such as, for example, silicon dioxide.

One problem of using copper as the metal in the BEOL interconnect structure is that copper is very reactive in air and readily forms a copper oxide. As such, exposed copper surfaces need to be passivated. Typically, a dielectric and/or metallic capping layer are employed in prior art copper-containing BEOL interconnect structures.

Another problem that arises when copper is used as the metal in the interconnect structure is that copper ions tend to diffuse into the interconnect dielectric material during use. The diffusion of copper ions from the metal feature into the dielectric material causes voids to form within the metal feature of the BEOL interconnect structure. These voids can lead to failure of the IC. As such, a diffusion barrier such as, for example, TiN, is typically used to reduce the diffusion of copper ions into the interconnect dielectric material and thus reduce the electromigration of copper from the metal feature.

Although various capping layers and diffusion barriers are known in the art, a need exists to provide an alternative material that can provide the same functions as the capping layers and the diffusion barriers mentioned above, yet reduce the resistivity of the copper metal within such BEOL interconnect structures.

SUMMARY

A contiguous layer of graphene is formed on exposed sidewall surfaces and a topmost surface of a copper-containing structure that is present on a surface of a substrate. The presence of the contiguous layer of graphene on the copper-containing structure reduces copper oxidation and surface diffusion of copper ions and thus improves the electromigration resistance of the structure. These benefits can be obtained using graphene without increasing the resistance of the copper-containing structure.

In one aspect of the present disclosure, a method of forming an interconnect structure is provided. The method of the present disclosure includes forming a sacrificial dielectric material on a surface of a substrate. Next, at least one opening is formed within the sacrificial dielectric material that exposes a portion of the surface of the substrate. A copper-containing structure is formed within the at least one opening and the exposed portion of the surface of the substrate. Remaining portions of the sacrificial dielectric material are removed and thereafter a contiguous layer of graphene is formed on exposed sidewall surfaces and a topmost surface of the copper-containing structure.

In another aspect of the present disclosure, an interconnect structure is provided. The interconnect structure includes at least one copper-containing structure located on a surface of a substrate. The structure of the present disclosure further includes a contiguous layer of graphene comprising a first portion located on each exposed sidewall surface of the copper-containing structure and a second portion located on a topmost surface of the at least one copper-containing structure, wherein a bottommost surface of the first portion of the contiguous layer of graphene is in contact with the surface of the substrate.

DETAILED DESCRIPTION

Figure 1:
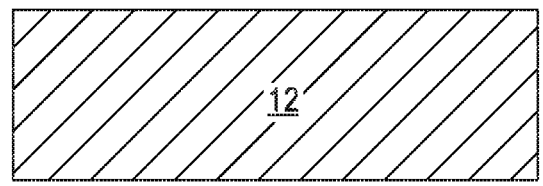
FIG. 1 is a pictorial representation (through a cross sectional view) illustrating a substrate that can be employed in one embodiment of the present disclosure.

The present disclosure, which provides a method of forming an interconnect structure and the interconnect structure that is formed from the method, will now be described in greater detail by referring to the following discussion and drawings that accompany the present application. It is noted that the drawings of the present application are provided for illustrative purposes and, as such, they are not drawn to scale. In the drawings and the description that follows, like elements are referred to by like reference numerals. For purposes of the description hereinafter, the terms "upper", "lower", "right", "left", "vertical", "horizontal", "top", "bottom", and derivatives thereof shall relate to the components, layers and/or elements as oriented in the drawing figures which accompany the present application.

In the following description, numerous specific details are set forth, such as particular structures, components, materials, dimensions, processing steps and techniques, in order to provide a thorough understanding of the present invention. However, it will be appreciated by one of ordinary skill in the art that the present disclosure may be practiced with viable alternative process options without these specific details. In other instances, well-known structures or processing steps have not been described in detail in order to avoid obscuring the various embodiments of the present disclosure.

The present disclosure provides interconnect structures including a contiguous layer of graphene that is formed on exposed sidewall surfaces and a topmost surface of a copper-containing structure that is present on a surface of a substrate. The presence of the contiguous layer of graphene on the copper-containing structure limits oxidation of copper thus allowing air-gap/low k dielectric material BEOL integration without increasing the copper resistance. Also, the presence of the contiguous layer of graphene on the copper-containing structure limits copper atom surface diffusion potentially lowering copper electromigration. The term "contiguous" as used throughout the present disclosure to describe the layer of graphene denotes that there are no physical breaks or interfaces between the various portions of graphene that are formed on the exposed surfaces of a copper-containing structure.

Referring to FIG. 1, there is illustrated a substrate 12 that can be employed in one embodiment of the present disclosure. The substrate 12 may comprise a semiconductor material, an insulator material, a conductive material, or any combination thereof including multilayers. When the substrate 12 is comprised of a semiconductor material, any semiconductor such as, for example, Si, SiGe, SiGeC, SiC, Ge alloys, GaAs, InAs, InP and other III/V or II/VI compound semiconductors may be used. In addition to these listed types of semiconducting materials, the substrate 12 can also be a layered semiconductor substrate such as, for example, Si/SiGe, Si/SiC, silicon-on-insulators (SOIs) or silicon germanium-on-insulators (SGOIs).

When the substrate 12 comprises a semiconductor material, one or more semiconductor devices such as, for example, complementary metal oxide semiconductor (CMOS) devices can be fabricated thereon.

When the substrate 12 is an insulator material, the insulator material can be an organic insulator, an inorganic insulator or a combination thereof including multilayers. When the substrate 12 is a conductive material, the substrate 12 may include, for example, polySi, an elemental metal, alloys of elemental metals, a metal silicide, a metal nitride or combinations thereof including multilayers. When the substrate 12 comprises a combination of an insulator material and a conductive material, the substrate 12 may represent a first interconnect level of a multilayered interconnect structure.

Figure 2:
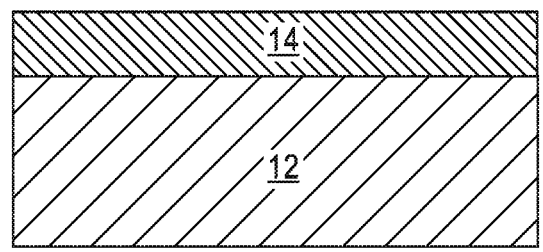
FIG. 2 is a pictorial representation (through a cross sectional view) illustrating the substrate of FIG. 1 after forming a sacrificial dielectric material on a surface of the substrate.

Referring to FIG. 2, there is illustrated the substrate 12 of FIG. 1 after forming a sacrificial dielectric material 14 on a surface of the substrate 12. The term "sacrificial dielectric material" is used throughout the present disclosure to denote any insulator material that can be selectively removed from the structure after forming a copper-containing structure on the substrate without adversely affecting the integrity of either the copper-containing structure or the substrate. Illustrative examples of insulator materials that can be used as the sacrificial dielectric material 14 of the present disclosure include, but are not limited to, aerogels, photoresists, diamond-like carbon (DLC), poly(methyl glutarimide (PGMI), Solgels, diazonaphthoquinone (DNQ) and thermoplastic polymers such as, for example, poly(methyl methacrylate) (PMMA).

The sacrificial dielectric material 14 can be formed utilizing any deposition process including, for example, chemical vapor deposition, plasma chemical vapor deposition, evaporation, chemical solution deposition, and spin-on coating.

In one embodiment of the present disclosure, the sacrificial dielectric material 14 has a thickness from 2 nm to 50 nm. In another embodiment, the sacrificial dielectric material 14 has a thickness from 20 nm to 200 nm. Other thicknesses that are below and/or above the above mentioned ranges can also be employed in the present disclosure.

Figure 3:
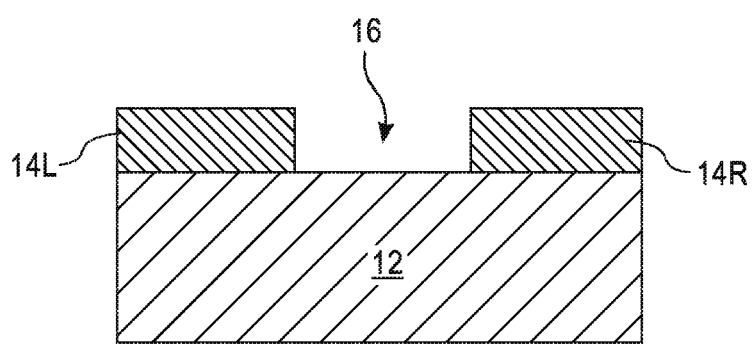
FIG. 3 is a pictorial representation (through a cross sectional view) illustrating the structure of FIG. 2 after forming at least one opening within the sacrificial dielectric material that exposes a portion of the surface of the substrate.

Referring to FIG. 3, there is illustrated the structure of FIG. 2 after forming at least one opening 16 within the sacrificial dielectric material 14 that exposes a portion of the surface of the substrate 12. In FIG. 3, reference numerals 14L, 14R denote remaining portions of the sacrificial dielectric material in which the at least one opening 16 is not present.

In some embodiments, at least one pad material (not shown) can be formed atop the sacrificial dielectric material 14 prior to forming the at least opening 16. The at least one pad material can be used as a pattern mask in the subsequent formation of the at least one opening 16. When the at least one pad material is present, the at least one pad material may be an oxide, nitride, oxynitride or multilayers thereof (e.g., a pad stack comprising a pad oxide and a pad nitride). The at least one pad material typically comprises a semiconductor oxide, a semiconductor nitride and/or a semiconductor oxynitride. In one embodiment, the at least one pad material comprises an oxide of silicon and/or a nitride of silicon.

In some embodiments, the at least one pad material may be formed utilizing any conventional deposition process including, for example, CVD, PECVD, evaporation, chemical solution deposition, physical vapor deposition (PVD) and atomic layer deposition. In other embodiments, the at least one pad material can be formed by a thermal process such as, for example, a thermal oxidation process, and/or a thermal nitridation process. In yet other embodiments, the at least one pad material can be formed utilizing a combination of deposition and thermal processes. The thickness of the at least one pad material may vary depending on the number of pad materials as well as the technique that was used in forming the same. Typically, the at least one pad material has a thickness from 10 nm to 80 nm.

Notwithstanding whether the at least one pad material is or is not employed, the at least one opening 16 can be formed into the sacrificial dielectric material 14 by lithography and etching. The lithographic step includes forming a photoresist (organic, inorganic or hybrid) atop the sacrificial dielectric material 14 utilizing a conventional deposition process such as, for example, CVD, PECVD and spin-on coating. Following formation of the photoresist, the photoresist is exposed to a desired pattern of radiation. Next, the exposed photoresist is developed utilizing a conventional resist development process.

After the development step, an etching step is performed to transfer the pattern from the patterned photoresist into the sacrificial dielectric material 14. When the at least one pad material is present, the etching step transfers the pattern from the patterned photoresist into the at least one pad material and thereafter into the sacrificial dielectric material 14. In such an embodiment, the patterned photoresist is typically removed from the surface of the structure after transferring the pattern into the at least one pad material utilizing a conventional resist stripping process such as, for example, ashing. In other embodiments, the patterned photoresist is removed after the pattern is completely transferred into the sacrificial dielectric material 14. The etching step used in forming the at least one opening 16 can comprise a dry etching process (including reactive ion etching, ion beam etching, plasma etching or laser ablation), a wet chemical etching process or any combination thereof. Typically, reactive ion etching is used to form the at least one opening 16.

In some embodiments in which the sacrificial dielectric material 14 is a photoresist material, a pattern can be formed directly into the sacrificial dielectric material 14 by exposing the same to a desired pattern of radiation and developing the same.

After forming the at least one opening 16, and in some embodiments of the present disclosure, the remaining portions of the at least one pad material can be removed from the structure at this point of the present disclosure by a conventional planarization process such as, for example, chemical mechanical polishing and/or grinding. Alternatively, the remaining portions of the at least one pad material can remain atop the remaining portions of the sacrificial dielectric material 14L, 14R and be removed during a subsequently performed planarization step that is used in forming the copper-containing structure.

The at least one opening 16 may include a via opening, a line opening, a combined via and line opening, or any combinations thereof. When a combined via and line opening is formed, a second iteration of lithography and etching is typically used to form the same. Via openings typically have a narrower width than line openings.

Figure 4:
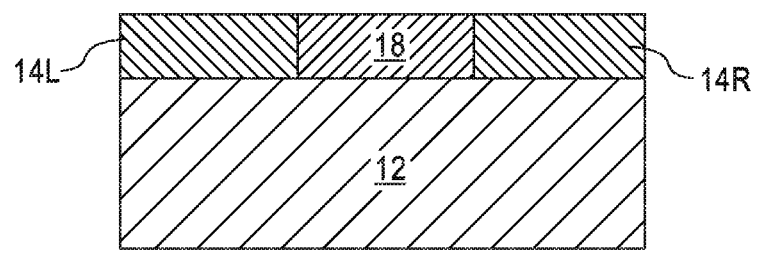
FIG. 4 is a pictorial representation (through a cross sectional view) illustrating the structure of FIG. 3 after forming a copper-containing structure within the at least one opening and the exposed portion of the surface of the substrate.

Referring to FIG. 4, there is illustrated the structure of FIG. 3 after forming a copper-containing structure 18 within the at least one opening 16 and the exposed portion of the surface of the substrate 12. As shown, the copper-containing structure 18 is formed between the remaining portions of the sacrificial dielectric material 14L, 14R. The copper-containing structure 18 may include a metal via, metal line, or a combined metal via and line, or any combination thereof.

In one embodiment, the copper-containing structure 18 may be composed of pure copper. In another embodiment, the copper-containing structure may be composed of a copper alloy. By "pure copper" it is meant a layer of copper that comprises 99% or greater copper and other impurities that are present in an amount of 1% or less. The term "copper alloy" denotes a compound that comprises copper and at least one other element such as, for example, Al, Be, or Mg.

The copper-containing structure 18 can be formed within the at least one opening 16 and between the remaining portions of the sacrificial dielectric material 14L, 14R by first depositing a layer of copper or copper alloy utilizing any conventional deposition process including, for example, chemical vapor deposition, plasma enhanced chemical vapor deposition, physical vapor deposition, sputtering, plating, chemical solution deposition and electroless plating. The layer of copper or copper alloy fills the entirety of the at least one opening 16 and extends atop the remaining portions of the sacrificial dielectric material 14L, 14R.

Following deposition of the layer of copper or copper alloy, a planarization process is used to remove the excess layer of copper or copper alloy that extends atop the remaining portions of the sacrificial dielectric material 14L, 14R. The planarization process that can be employed at this point of the present disclosure may include, for example, chemical mechanical polishing and/or grinding. As shown in FIG. 4, a copper-containing structure 18 is formed having a topmost surface that is coplanar with a topmost surface of each remaining portions of the sacrificial dielectric material 14L, 14R.

In some embodiments of the present disclosure, the remaining portions of the at least one pad material that remained atop the remaining portions of the sacrificial dielectric material 14L, 14R can be removed during the above described planarization step that is used in forming the copper-containing structure 18.

Figure 5:
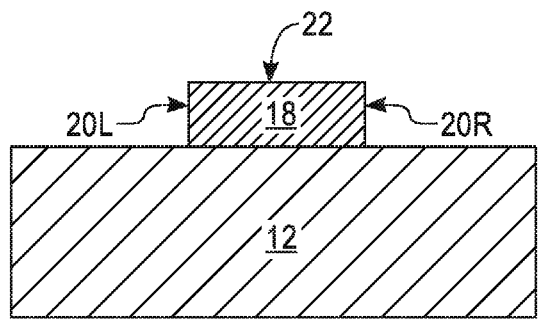
FIG. 5 is a pictorial representation (through a cross sectional view) illustrating the structure of FIG. 4 after removing remaining portions of the sacrificial dielectric material.

Referring to FIG. 5, there is illustrated the structure of FIG. 4 after removing the remaining portions of the sacrificial dielectric material 14L, 14R. The removal of the remaining portions of the sacrificial dielectric material 14L, 14R from the structure exposes sidewall surfaces 20L, 20R, and a topmost surface 22 of the copper-containing structure 18.

In one embodiment, the removal of the remaining portions of the sacrificial dielectric material 14L, 14R from the structure may include a dry etching process such as, for example, reactive ion etching, ion beam etching and plasma etching. In another embodiment, the removal of the remaining portions of the sacrificial dielectric material 14L, 14R from the structure may include a wet chemical etching process in which a chemical etchant is employed. In one embodiment, the chemical etchant that is employed in the present disclosure for removing the remaining portions of the sacrificial dielectric material 14L, 14R from the structure includes oxygen, $H_2O$ and $H_2$ low power RIE or low energy plasma processes using the same species.

Figure 6A:
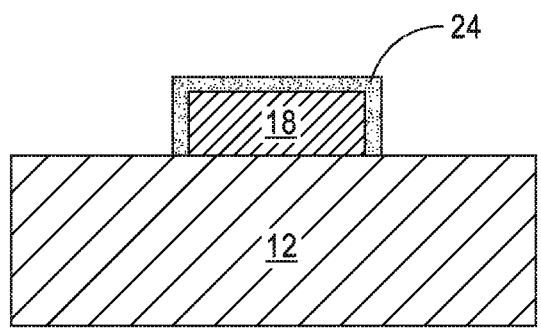
FIG. 6A is a pictorial representation (through a cross sectional view) illustrating the structure of FIG. 5 after forming a contiguous layer of graphene on exposed sidewall surfaces and a topmost surface of the copper-containing structure.

Referring to FIG. 6A, there is illustrated the structure of FIG. 5 after forming a contiguous layer of graphene 24 on the exposed sidewall surfaces 20L, 20R, and the topmost surface 22 of the copper-containing structure 18. Specifically, the contiguous layer of graphene 24 comprises a first portion located on each exposed sidewall surface 20L, 20R of the copper-containing structure 18 and a second portion located on a topmost surface 22 of the copper-containing structure 18, wherein a bottommost surface of the first portion of the contiguous layer of graphene 24 is in contact with an uppermost surface of the substrate. In the drawings, the first portions and second portion of the contiguous layer of graphene 24 are not explicitly labeled since one skilled in the art would know their location from the description provided above.

The term "graphene" as used throughout the present disclosure denotes a one-atom-thick planar sheet of $sp^2$-bonded carbon atoms that are densely packed in a honeycomb crystal lattice. The graphene employed in the present disclosure as the contiguous layer of graphene 24 has a two-dimensional (2D) hexagonal crystallographic bonding structure.

The contiguous layer of graphene 24 can be comprised of single-layer graphene (nominally 0.34 nm thick), few-layer graphene (2-10 graphene layers), multi-layer graphene (>10 graphene layers), a mixture of single-layer, few-layer, and multi-layer graphene, or any combination of graphene layers mixed with amorphous and/or disordered carbon phases that result by graphene formation at lower temperatures (between 200° C. and 900° C.). The contiguous layer of graphene 24 can also include, if desired, substitutional (where C atoms in graphene are replaced with dopant atoms covalently bonded to next nearest neighbor, nnn, atoms), and dopant atoms or molecules that do not form covalent bonds to graphene and lie on top of the graphene layer or between graphene layers in the case few layer or multilayer intercalated graphene.

In one embodiment, the contiguous layer of graphene 24 can be formed utilizing a selective deposition process such as, for example, chemical vapor deposition (CVD), plasma enhanced chemical vapor deposition (PECVD), and ultraviolet (UV) assisted CVD. The selective deposition process that can be employed in the present disclosure is initiated on the exposed surfaces of the copper-containing structure 18. The selective deposition, i.e., catalytic growth, of the contiguous layer of graphene 24, on exposed surfaces of the copper-containing structure 18 can be performed at a temperature up to, but not exceeding, 450° C. In one embodiment, the selective growth of graphene occurs at a temperature from 200° C. to 400° C. In another embodiment, the selective growth of graphene occurs at a temperature from 350° C. to 400° C. It is noted that growth temperatures which exceed 450° C. are not used in copper-containing interconnect structures since at such high temperature the integrity and service lifetime of the copper interconnects can be negatively affected. The selective deposition process that can be used in the present disclosure for graphene growth includes utilizing any known carbon sources including, for example, benzene, propane, ethane and other hydrocarbons, and other carbon-containing gases.

If higher quality graphene is necessary to be used for forming the contiguous layer of graphene 24, then graphene that is initially grown on copper foils can be transferred onto the exposed surfaces of the copper-containing structure 18, and then be optionally patterned by photolithography and etching. One or more the contiguous layers of graphene can be transferred sequentially using a single step or multi-step transfer process, respectively. The copper foils as well as any base substrate that the copper foils might be located thereon can be removed during the transfer process.

Figure 6B:
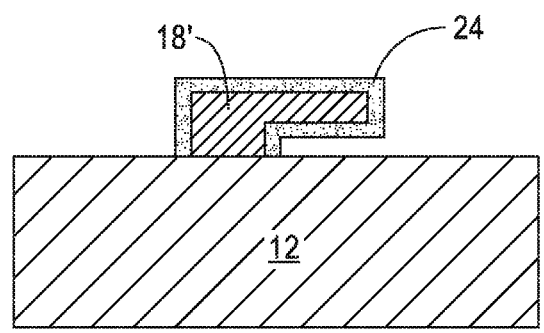
FIG. 6B is a pictorial representation (through a cross sectional view) illustrating another structure after forming a contiguous layer of graphene on exposed sidewall surfaces and a topmost surface of a copper-containing structure which is present on a substrate.

Referring now to FIG. 6B, there is illustrated an exemplary structure of the present disclosure after forming a contiguous layer of graphene 24 on exposed sidewall surfaces and a topmost surface of a copper-containing structure 18' which is present on a surface of substrate 10. In the exemplary structure illustrated in FIG. 6B, the copper-containing structure 18' is in the form of a combined metal via and metal line.

Figure 7:
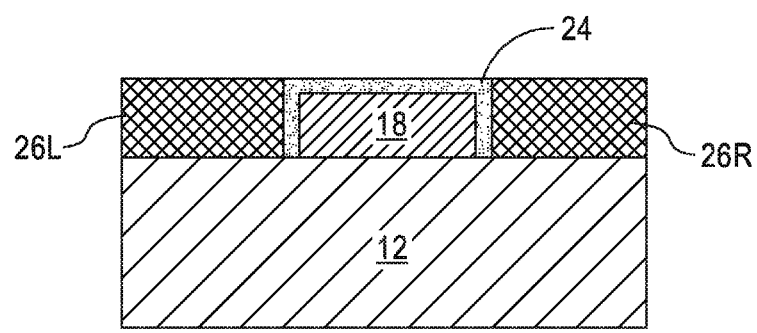
FIG. 7 is a pictorial representation (through a cross sectional view) illustrating the structure of FIG. 6A after forming a low k dielectric material and etching back the low k dielectric material.

Referring to FIG. 7, there is illustrated the structure of FIG. 6A after forming a low k dielectric material and etching back the low k dielectric material. In some embodiments, this step is omitted and thus an air-gap is present between neighboring copper-containing structures. Such an embodiment is shown, for example, in FIG. 8.

The processing steps of low k dielectric material deposition and etching back provide low k dielectric material portions 26L, 26R located adjacent to the copper-containing structure 18 and separated from the copper-containing structure 18 by the first portion of the contiguous layer of graphene 24 that is present on sidewalls 20L, 20R of the copper-containing structure 18.

The term "low k dielectric material" is used throughout the present disclosure to denote an insulator material whose dielectric constant (as measured in vacuum) is less than that of silicon dioxide. The low k dielectric materials that can be employed in the present disclosure include any interlevel or intralevel dielectric including inorganic dielectrics or organic dielectrics. The low k dielectric material may be porous, non-porous or contain regions and/or surfaces that are porous and other regions and/or surfaces that may be non-porous. Some examples of suitable dielectrics that can be used as the low k dielectric material include, but are not limited to, silsesquioxanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

In some embodiments of the present disclosure, the low k dielectric material that can be employed in the present disclosure has a dielectric constant that is about 3.8 or less. In another embodiment, the low k dielectric material that can be employed in the present disclosure can have a dielectric constant of about 3.2 or less. All dielectric constants mentioned herein are relative to a vacuum, unless otherwise noted. Low k dielectric materials generally have a lower parasitic cross talk as compared with dielectric materials that have a dielectric constant that is equal to or greater than the dielectric constant of silicon dioxide.

The low k dielectric material that can be employed in some embodiments of the present disclosure can be formed utilizing any conventional deposition process including, but not limited to chemical vapor deposition, plasma enhanced chemical vapor deposition, evaporation, chemical solution deposition and spin-on coating.

After depositing the low k dielectric material, an etch back process is used to provide the structure shown in FIG. 7. In one embodiment, the etch back process includes a dry etching process such as, for example, reactive ion etching, ion beam etching and plasma etching. In another embodiment, the etch back process includes a wet chemical etching process in which a chemical etchant is employed. In one embodiment, the chemical etchant that is employed in the present disclosure during the etch back process includes a room temperature (20° C.-40° C.) oxalic acid bath. This could also be a low temperature, buffered low concentration sulfuric bath.

Figure 8:
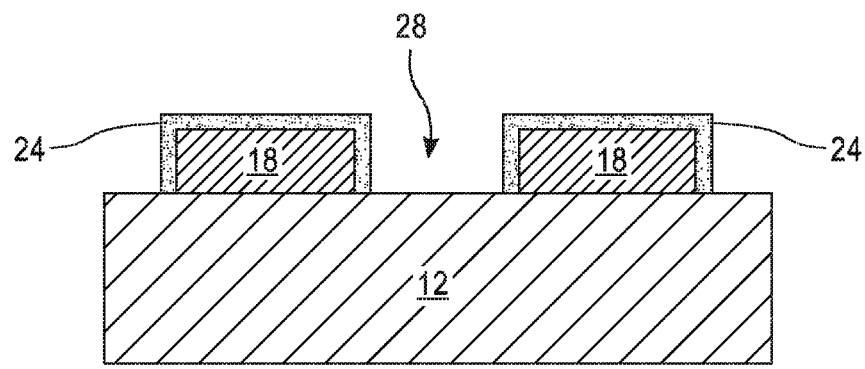
FIG. 8 is a pictorial representation (through a cross sectional view) illustrating an air-gap-containing interconnect structure including two copper-containing structures which include a contiguous layer of graphene located on exposed surfaces of the each copper-containing structure in accordance with an embodiment of the present disclosure.

Referring to FIG. 8, there is illustrated an air-gap-containing interconnect structure including two copper-containing structures 18 which include a contiguous layer of graphene 24 located on exposed surfaces of the each copper-containing structure 18 in accordance with an embodiment of the present disclosure. This structure shown in FIG. 8 is formed utilizing the basic processing steps described above and illustrated in FIGS. 1-6A of the present disclosure. In FIG. 8, reference numeral 28 denotes an air-gap that is located between the two graphene-coated copper-containing structures (18, 24).

Figure 9:
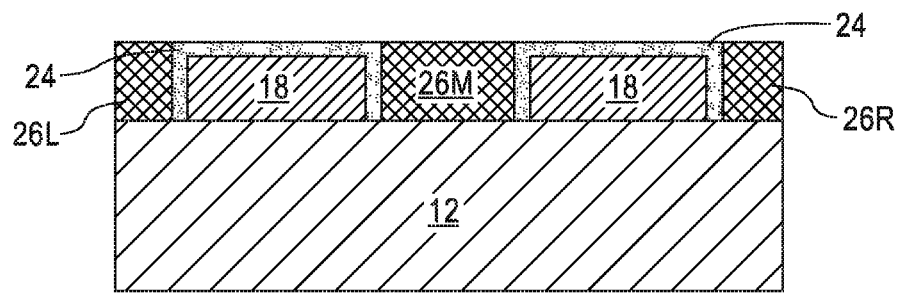
FIG. 9 is a pictorial representation (through a cross sectional view) illustrating a low-k containing interconnect structure including two copper-containing structures which include a contiguous layer of graphene located on exposed surfaces of the each copper-containing structure in accordance with an embodiment of the present disclosure.

Referring to FIG. 9, there is illustrated a low-k-containing interconnect structure including two copper-containing structures 18 which include a contiguous layer of graphene 24 located on exposed surfaces of the each copper-containing structure 18 in accordance with an embodiment of the present disclosure. This structure shown in FIG. 9 is formed utilizing the basic processing steps described above and illustrated in FIGS. 1-6A and 7 of the present disclosure. In FIG. 9, reference numerals 26L, 26M, and 26R, denote portions of the low k dielectric material that can be located between adjacent graphene-coated copper-containing structures (18, 24).

In some embodiments of the present disclosure, the above processing steps can be repeated to form other interconnect levels atop the interconnect levels shown in FIGS. 6A, 6B, 7, 8, and 9 of the present disclosure. When other interconnect levels are formed atop the interconnect level shown in one of FIGS. 6A, 6B, 7, 8 and 9, an optional dielectric capping layer or other like material can be formed atop the structures shown in FIGS. 6A, 6B, 7, 8 and 9 prior to repeating the various processing steps of the present disclosure. The dielectric capping layer may include for example, SiC, $Si_4NH_3$, $SiO_2$, a carbon doped oxide, a nitrogen and hydrogen doped silicon carbide or multilayers thereof. The dielectric capping layer can be formed utilizing any known deposition process such as, for example, chemical vapor deposition, plasma enhanced chemical vapor deposition, chemical solution deposition, evaporation and atomic layer deposition. In one embodiment, of the thickness of the dielectric capping layer is typically within a range from 10 nm to 100 nm. In another embodiment the thickness of the dielectric capping layer is within a range from 20 nm to 50 nm.

After forming the dielectric capping layer, and in some embodiments of the present disclosure, the above processing steps can be repeated to form another interconnect level atop the previously formed interconnect level. For example, the formation of the another interconnect level can include forming another sacrificial dielectric material on a surface of the dielectric capping layer; forming at least one other opening within the another sacrificial dielectric material that exposes a portion of the surface of the dielectric capping layer; forming another copper-containing structure within the at least one other opening and the exposed portion of the surface of the dielectric capping layer; removing remaining portions of the another sacrificial dielectric material; and forming another contiguous layer of graphene on exposed sidewall surfaces and a topmost surface of the another copper-containing structure.

Figure 10A:
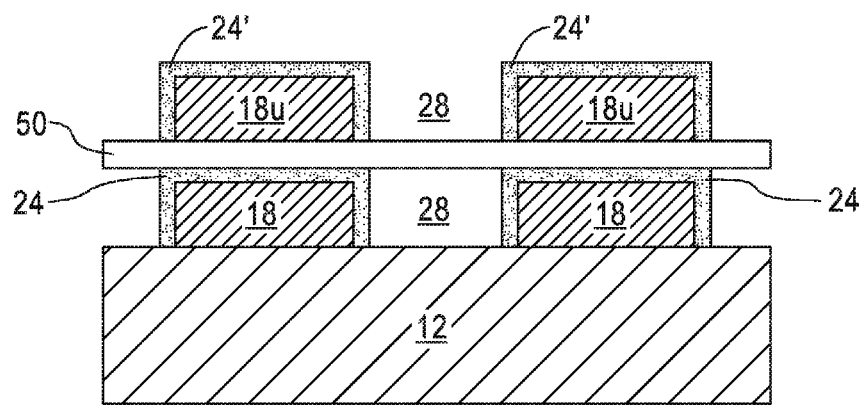
FIG. 10A is a pictorial representation (through a cross sectional view) illustrating an exemplary multilevel interconnect structure that can be formed utilizing the basic processing steps of the present disclosure.
Figure 10B:
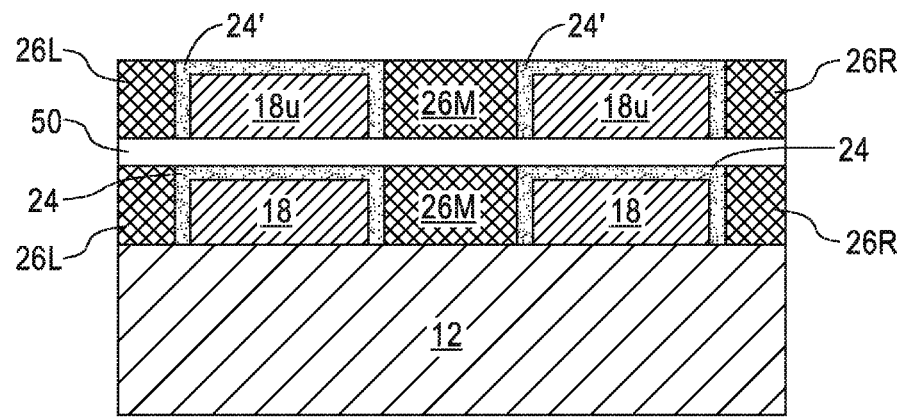
FIG. 10B is a pictorial representation (through a cross sectional view) illustrating another exemplary multilevel interconnect structure that can be formed utilizing the basic processing steps of the present disclosure.

Referring to FIGS. 10A-10B, there are illustrated exemplary interconnect structures of the present disclosure which include a first interconnect level and a second interconnect level. The first interconnect level is composed of a plurality of copper-containing structures 18 that are laterally spaced apart from each other. Each copper-containing structure 18 includes a contiguous layer of graphene 24 on exposed sidewall surfaces and topmost surface of the copper-containing structure 18. In the embodiment illustrated in FIG. 10A, an air-gap 28 separates each of the copper-containing structures 18 including the contiguous layer of graphene 24. In FIG. 10B, dielectric material portions 26L, 26M and 26 R are present and separate each copper-containing structure within the first interconnect level. A dielectric capping layer or other like material can be present atop the first interconnect level. In the drawings, reference numeral 50 denotes the dielectric capping layer or other like material that can be located atop the first interconnect level.

A second interconnect level is located atop layer 50. The second interconnect level includes a plurality of other copper-containing structures 18u that include another contiguous layer of graphene 24' located on exposed surfaces of each copper-containing structure of the plurality of other copper-containing structures 18u. In some embodiments, each other copper-containing structure 18u can be vertically coincident with an underlying copper-containing structure 18 in the first interconnect level. In other embodiments, the other copper-containing structures 18u are not vertically coincident with any underlying copper-containing structures 18 in the first interconnect level. In the embodiment illustrated in FIG. 10A, an air-gap 28 separates each of the other copper-containing structures 18u including the another contiguous layer of graphene 24'. In FIG. 10B, dielectric material portions 26L, 26M and 26 R are present and separate each other copper-containing structure 18u within the second interconnect level.

In some embodiments of the present invention, an interconnect level may include only air-gaps separating each adjacent graphene-coated copper-containing structure. In other embodiments, an interconnect level may include only a low k dielectric material separating each adjacent graphene-coated copper-containing structure. In further embodiments, an interconnect level may include some air-gaps separating preselected adjacent graphene-coated copper-containing structures and some low k dielectric material portions separating other preselected adjacent graphene-coated copper-containing structures. When multiple interconnect levels are present, the multiple interconnect levels can comprise any of the above combinations of structures including air-gaps and/or low k dielectric material portions separating the graphene-coated copper-containing structures.

In any of the various embodiments of the present disclosure, the presence of the contiguous layer graphene on the copper-containing structure reduces copper oxidation and surface diffusion of copper ions and thus improves the electromigration resistance of the structure. These benefits can be obtained using graphene without increasing the resistance of copper-containing structure.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. An interconnect structure comprising:
   at least one copper-containing structure located on a surface of a substrate;
   a contiguous layer of graphene comprising a first portion located on each exposed sidewall surface of said at least one copper-containing structure and a second portion located on a topmost surface of said at least one copper-containing structure, wherein a bottommost surface of said first portion of said contiguous layer of graphene is in contact with a portion of said surface of said substrate; and
   a dielectric material portion having a dielectric constant of less than silicon dioxide located on each side of the at least one copper-containing surface, wherein each dielectric material portion has a bottommost surface in contact with another portion of said surface of said substrate, a topmost surface that is horizontally coplanar with a topmost surface of said second portion of said contiguous layer of graphene and a sidewall surface in contact with said first portion of said at least one copper-containing structure.

2. The interconnect structure of claim 1, wherein said copper-containing structure comprises pure copper.

3. The interconnect structure of claim 1, wherein said at least one copper-containing structure comprises a copper alloy.

4. The interconnect structure of claim 1, wherein said at least one copper-containing structure is a metal via or metal line.

5. The interconnect structure of claim 1, wherein said contiguous layer of graphene comprises single-layer graphene, few-layer graphene, or multi-layer graphene.

6. The interconnect structure of claim 1, wherein said contiguous layer of graphene comprises graphene mixed with amorphous and/or disordered carbon phases.

7. The interconnect structure of claim 1, wherein the at least one copper-containing structure includes a plurality of copper-containing structures, and each copper-containing structure of said plurality of copper-containing structures includes said contiguous layer of graphene located on each exposed sidewall surfaces and topmost surface of each copper-containing structure of said plurality of copper-containing structures.

8. The interconnect structure of claim 7, wherein an air-gap is located between each neighboring copper-containing structure including said contiguous layer of graphene.

9. The interconnect structure of claim 7, wherein said dielectric material portion is located between each neighboring copper-containing structure including said contiguous layer of graphene.

10. The interconnect structure of claim 1, wherein said dielectric material portion is selected from the group consisting of a silsesquioxane, a C doped oxide that include atoms of Si, C, O and H, a thermosetting polyarylene ether, and multilayers thereof.

11. The interconnect structure of claim 1, wherein said substrate comprises at least a semiconductor material having at least one semiconductor device located thereon.

12. The interconnect structure of claim 1, further comprises a dielectric capping layer located atop the at least one copper-containing structure including said contiguous layer of graphene.

13. The interconnect structure of claim 12, further comprising another at least one copper-containing structure located atop said dielectric capping layer, wherein said another at least one copper-containing structure includes another contiguous layer of graphene comprising a first portion located on each exposed sidewall surface of said another at least one copper-containing structure and a second portion located on a topmost surface of said another at least one copper-containing structure, wherein a bottommost surface of said first portion of said another contiguous layer of graphene is in contact with a surface of dielectric capping layer.

14. The interconnect structure of claim 13, wherein the another at least one copper-containing structure includes a plurality of other copper-containing structures, and each copper-containing structure of said plurality of other copper-containing structures includes said another contiguous layer of graphene located on each exposed sidewall surface and topmost surface of each copper-containing structure of said plurality of other copper-containing structures.

15. The interconnect structure of claim 14, wherein an air-gap is located between each neighboring copper-containing structure of said plurality of other copper-containing structures.

16. The interconnect structure of claim 14, wherein a dielectric material portion having a dielectric constant of less than silicon dioxide is located between each neighboring copper-containing structure of said plurality of other copper-containing structures.

\* \* \* \* \*